United States Patent [19]

Iwamura et al.

[11] Patent Number: 5,168,397
[45] Date of Patent: Dec. 1, 1992

[54] MAGNETIC REPRODUCING HEAD AMPLIFIER

[75] Inventors: Soichi Iwamura, Fuchu; Eiichi Takakura, Kashiwa; Tadashi Itsumi, Misato, all of Japan

[73] Assignee: Sharp Kabushiki Kaisha, Osaka, Japan

[21] Appl. No.: 495,164

[22] Filed: Mar. 19, 1990

[30] Foreign Application Priority Data

Mar. 31, 1989 [JP] Japan .................................. 1-81703
Jul. 11, 1989 [JP] Japan .................................. 1-180010
Dec. 27, 1989 [JP] Japan .................................. 1-341028

[51] Int. Cl.$^5$ ........................ G11B 5/02; G11B 15/14
[52] U.S. Cl. ....................................... 360/67; 360/65
[58] Field of Search .................................... 360/67, 65

[56] References Cited

U.S. PATENT DOCUMENTS

| 3,747,007 | 7/1973 | Geitner | 330/107 X |
| 4,437,069 | 3/1984 | Kleinberg | 330/109 |
| 4,547,819 | 10/1985 | Meitner et al. | 360/65 |
| 4,956,729 | 9/1990 | Yatsugi et al. | 360/67 |

FOREIGN PATENT DOCUMENTS

| 293020 | 3/1988 | European Pat. Off. |
| 58-32207 | 2/1983 | Japan |
| 58-60407 | 4/1983 | Japan |
| 63-102003 | 5/1988 | Japan |
| 1383204 | 2/1975 | United Kingdom |
| 2108797 | 5/1983 | United Kingdom |

OTHER PUBLICATIONS

Elecktronik, H. 12, Jun. 13, 1986, Munchen, DE, "Hybridverstarker treibt 50 gamma-Lasten im Videobereich".

Primary Examiner—David J. Severin

[57] ABSTRACT

A magnetic reproducing head amplifier includes a differential amplifier referred to as one of these three types: a balanced input type, a balanced output type, or a balanced input/output type. The amplifier has at least one positive feedback circuit for passing a positive feedback current to the differential amplifier, and at least one negative feedback circuits for passing a negative feedback current to the differential amplifier and is configured so that a positive feedback and a negative feedback are simultaneously performed by the positive feedback circuit as well as the negative feedback circuit. A resonance peak characteristic at the input part of the differential amplifier is dumped by the negative feedback current, and therefore a frequency characteristic as well as a group delay characteristic of the output of the differential amplifier becomes flattened. Moreover, the use of the positive feedback current from the positive feedback circuit permits the charging current from the signal source to the input capacitance of the differential amplifier to be reduced, that is to say, an effective input capacitance is reduced, and thereby a resonance frequency at the input part of the differential amplifier can be shifted to the vicinity of the upper limit of the transmission band. Consequently, a stable amplification operation can be achieved for FM carriers for carrying wide frequency signals, such as HDTV signals.

7 Claims, 9 Drawing Sheets

MAGNETIC REPRODUCING HEAD AMPLIFIER

FIELD OF THE INVENTION

The present invention relates to a magnetic reproducing head amplifier for amplifying FM carriers, more concretely, FM carriers which carry wide-band frequency signals such as HDTV(high definition television) signals, reproduced from a magnetic tape by a magnetic head in a VTR(video tape recorder).

BACKGROUND OF THE INVENTION

As a VTR for recording and reproducing image signals of a standard television system, there is known an apparatus which has a circuit configuration shown in FIG. 7 including a magnetic reproducing head amplifier 53 (hereinafter called first prior art).

In the first prior art, image signals reproduced from a magnetic tape (not shown) by a magnetic head 51 located on a rotary drum are entered to a magnetic reproducing head amplifier 53 through a rotary transformer 52 composed of a rotor on the rotary drum and a stator on a fixed drum, and are released therefrom through a reproducing amplifier 54 and an equalizer 55 after being amplified by the magnetic reproducing head amplifier 53.

An equivalent circuit obtained by reducing the circuit shown in FIG. 7 at the secondary side(stator side) of the rotary transformer 52 is shown in FIG. 8, where a stray capacitance at the rotor side is omitted. In the figure, $C_{in}$ represents an input capacitance of the magnetic reproducing amplifier 53; in the same manner, $C_{s1}$ as well as $C_{s2}$: stray capacitance to ground of signal wiring; $L_H$: a head inductance of the magnetic head 51; $R_H$: a head resistor of the magnetic head 51 (corresponding to a head loss); n: turn ratio; the secondary side to the primary side (stator side to rotor side) of the rotary transformer 52; $L_2$: a coil inductance at the secondary side of the rotary transformer 52; $L_T$: a leakage inductance of the rotary transformer 52.

In the above, since $L_T << n^2 \cdot L_H << L_2$ are satisfied within the range of n=1 to 1.5 (n: turn ratio), the equivalent circuit shown in FIG. 8 is simplified into the one shown in FIG. 9. Now $C_s$ represents the reduced input capacitance of an amplifier including the input capacitance $C_{in}$, stray capacitances to ground $C_{s1}$ and $C_{s2}$, and other capacitances. The resonance peak frequency $f_o$ of the above resonance circuit is normally set at the vicinity of the upper limit of FM carrier transmission band as shown in a curve (A) in FIG. 10, for example, by the use of an externally attached capacitor 56. However, these days it is rear to especially install the capacitor 56, and in the case where the capacitor 56 is not used, the sensitivity is heightened by increasing the coil inductance $L_H$.

Generally, in the magnetic reproducing head amplifier 53 of a standard television system, when there is a resonance peak frequency $f_o$ within a transmission band for FM carrier, it is difficult to simultaneously perform an inverted compensation for resonance characteristic (to restore a preferable characteristic of amplifier frequency) and a head aperture compensation as its original purpose, that is, an equalization compensation, only by the use of the equalizer 55. Therefore, at first, in order to dump a resonance characteristic, dividing resistors 57 and 58 as well as a negative feedback resistor 59 are installed as shown in FIG. 7, and by properly setting the values of these resistors, without decreasing the CN ratio for the FM carrier and with dispersions of the reproducing sensitivity or other characteristics of the magnetic head 51 being controlled, a gain frequency characteristic of the magnetic reproducing head amplifier 53 is flattened as shown in a curve (B) in FIG. 10, and then the equalization compensation in high frequency range is performed by FM equalization in the equalizer 55.

Moreover, in order to shift the upper limit of the frequency transmission band for an FM carrier to the higher freqence side, by adding a capacitor 60 for widening band width, as shown with dotted lines in FIG. 7, the gain-frequency characteristic (B) of the magnetic reproducing head amplifier 53 is shifted to have a wider band as shown in a curve (D) in FIG. 10, and such a resonance characteristic as shown in a curve (C) is obtained by the equalization compensation at the equalizer 55.

On the other hand, in a VTR for recording and reproducing wide-band image signals such as HDTV baseband signals having a luminance signal band width of 20 MHz, for example, TCI (Time Compressed Integration) signals having a baseband width 12 MHz are divided into two channels in its band width, and frequency modulation is performed on their respective carriers. However, FM carrier spectrum for each channel has a wide-band distribution characteristic ranging from a lower vicinity of 6 MHz to a higher vicinity of 30 MHz even in the first side band, supposing, for example, 18 MHz is a central carrier frequency, and therefore it is necessary for the magnetic reproducing head amplifier to have a wide-band frequency characteristic to deal with the above band width.

One example of the configuration of a VTR for HDTV is shown in FIG. 11. Referring to the example of the configuration (hereinafter called the second prior art) in FIG. 11, in reproduction, an FM carrier for HDTV reproduced by a combined-use recording/reproducing head 62 is entered to a head amplifier 64 through a rotary transformer 63. Between the rotary transformer 63 and the head amplifier 64, is installed a recording-reproduction changeover switch 64, which connects the circuit to PB sides in reproduction as shown in the figure and, on the other hand, changes the connection to REC sides in recording, and thereby an FM recording current supplied from a recording amplifier (not shown) is released to the combined-use recording/reproducing head 62 through the rotary transformer 63. In the VTR for HDTV, as the rotary transformer 63, that of a flat-plate type is normally used, which has a turn ratio of 2:2 (rotor side to stator side).

Furthermore, referring to another example of the configuration of a VTR for HDTV (hereinafter called the third prior art) shown in FIG. 12, a rotary drum has a combined-use recording/reproducing head 66, a first recording-reproduction changeover switch 67, a head amplifier 68 and a second recording-reproduction changeover switch 70 built therein, and the second recording-reproduction changeover switch 70 is connected to a reproducing amplifier 73 through a rotary transformer 71 and a third recording-reproduction changeover switch 72. Also in this case, the recording-reproduction changeover switches 67, 70, 72 are connected to PB sides in reproduction and, on the other hand, change the connections to REC sides in recording.

In another example of the configuration of a VTR for HDTV (hereinafter called the fourth prior art) shown in FIG. 13, a magnetic head for recording 74 and a magnetic head for reproduction 75 are separately secured to a rotary drum, and a head amplifier 76 is also installed in the rotary drum. The magnetic head for recording 74 is connected to a recording amplifier 78 through a rotary transformer 77, and on the other hand, the head amplifier 76 is connected to a reproducing amplifier 81 through a rotary transformer 80.

Hereupon, as described above, with respect to FM carrier for carrying HDTV signals, whose transmission frequency band has its upper frequency limit of 30 MHz, in order to maintain a stable output amplitude characteristic in an amplifier at a step downstream, it is favorable not to contain the resonance peak frequency $f_o$ of the head amplifier input circuit within the FM carrier transmission band in the output-frequency characteristic of a magnetic reproducing head amplifier.

In the meantime, since noise generated in the head amplifier is substantially constant, the CN ratio for the FM carrier may be improved when an input carrier level to the head amplifier is raised by increasing the turn ratio n for the rotary transformer. However, when the turn ratio n is increased, there arises a problem in that the resonance peak frequency $f_o$ is reduced. For example, referring to the second prior art (FIG. 11), in the case where the inductance of the combined-use recording/reproducing head 62 is 1 μH and the turn ratio n for the rotary transformer 63 is 3:2 (stator side:-rotor side), the input reduced capacitance $C_s$ of the head amplifier 64 including the input capacitance $C_{in}$, the stray capacitances to ground $C_{s1}$, $C_{s2}$ and other capacitances amounts to 13 pF, and only that much amount brings the resonance peak frequency $f_o$ to less than 30 MHz.

Generally, in the case where the head amplifier input capacitance $C_{in}$ is great, or its stray capacitances to ground $C_{s1}$, $C_{s2}$ are great, as shown in a curve (E) in FIG. 14, the resonance peak frequency of the input circuit gets reduced from $f_o$ lying out of the FM carrier transmission band (a curve (F)) to $f_o'$, and therefore is normally included within the FM carrier transmission band (a curve (B)). In that case, in addition to a required equalization compensation (see a curve (H) in FIG. 15) by an equalizer (see FIG. 7) at a step downstream according to the aperture characteristic of the recording-/reproducing head 62 (see a curve (G) in FIG. 15), an inverted compensation for the resonance characteristic of the resonance peak frequency $f_o'$ must be simultaneously performed by the same equalizer, and consequently an equalization for a steep rise in high frequency range as shown in a curve (I) in FIG. 15 is inevitable, thereby causing it very difficult to maintain a stable characteristic of the equalizer.

Furthermore, referring to the third prior art(FIG. 12), by installing the head amplifier 68 in the rotary drum, since the stray capacitances to ground can be excluded from the head amplifier input reduced capacitance $C_s$, the $C_s$ gets reduced by $C_s=C_{in}$, and therefore the resonance frequency is maintained high. However, in this case it is necessary to dispose the first and the second recording-reproduction changeover switches 67, 70 both at the front and the rear of the head amplifier 68 inside the rotary drum, and thereby a complicated structure is required.

Moreover, the fourth prior art(FIG. 13) has a configuration wherein the first and the second recording-reproduction changeover switches 67, 70 are omitted from the third prior art. Also in this case, the resonance peak frequency can be maintained high; however it requires a complicated structure like the third prior art in that the magnetic head for recording 74 and the magnetic head for reproduction 75 are necessary as respective separate devices in addition to the doubled number of channels for the rotary transformers 77, 80.

SUMMARY OF THE INVENTION

It is an object of the present invention to maintain a stable amplification operation, to reduce unwanted noise, and to flatten amplitude characteristics as well as group delay characteristics for wide band signals by shifting a resonance frequency in a resonance circuit, which is formed of an input inductance, an input capacitance and other capacitances at the input system of a magnetic reproducing head amplifier, to the vicinity of the upper limit of transmission frequency band, without using a complicated circuit configuration.

In order to achieve the above object, the circuit configuration of the present invention comprises a differential amplifier referred to as one of these three types: a balanced input type, a balanced output type, or a balanced input/output type, and is characterized in that by attaching a positive feedback circuit and a negative feedback circuit to the differential amplifier, a positive feedback and a negative feedback are simultaneously performed.

According to the above configuration, by the use of a negative feedback current from the negative feedback circuit, a resonance peak characteristic at the input system of the differential amplifier is dumped, and thereby a frequency characteristic as well as a group delay characteristic of the output of the differential amplifier may be flattened. Moreover, the use of a positive feedback current from the positive feedback circuit permits a charging current for the input capacitance of the differential amplifier from the signal source to be reduced, that is to say, an effective input capacitance may be reduced, and thereby a resonance frequency at the input circuit of the differential amplifier may be shifted to the vicinity of the upper limit of FM carrier transmission band. For example, even when an equalization characteristic (a curve (H) in FIG. 15) is utilized to compensate an aperture characteristic (a curve (G) in the same) together with an inverted compensation dealing with a resonance frequency $f_o$, the burden of an equalizer may be lightened because of the reduction of an equalizing amount by FM equalization as shown in a curve (J) in FIG. 15. Consequently, the maintenance of a stable amplification operation as well as the reduction of unwanted noise may be achieved for wide band signals.

For a fuller understanding of the nature and advantages of the invention, reference should be made to the ensuing detailed description taken in conjunction with the accompanying drawings.

BRIEF DESCRIPTION OF THE DRAWINGS

FIG. 1 is circuit schematic showing a magnetic reproducing head amplifier.

FIG. 2 is a graph showing a frequency characteristic of the gain of a magnetic reproducing head amplifier.

FIG. 3 is a diagram showing the phase of input voltage and current in a low frequency range of a magnetic reproducing head amplifier.

FIG. 4 is a diagram showing the phase of input voltage and current in a high frequency range of a magnetic reproducing head amplifier.

FIG. 7 is a circuit schematic showing a part of a VTR for a standard television system.

FIG. 8 is a circuit schematic showing an equivalent circuit to the circuit shown in FIG. 7.

FIG. 9 is a simplified equivalent circuit of FIG. 8.

FIG. 10 is a graph showing a frequency characteristic of the gain of a magnetic reproducing head amplifier in a circuit shown in FIG. 7.

FIGS. 11 to 13 are circuit schematics respectively showing a part of a VTR for HDTV.

FIG. 14 is a graph showing a frequency characteristic of the gain of a VTR for a HDTV.

FIG. 15 is a graph showing a transmission characteristic of an equalizer in a VTR for HDTV.

DESCRIPTION OF THE EMBODIMENTS

One way of carrying out the present invention is described in detail with reference to FIGS. 1 to 4 as follows.

Figure 1:
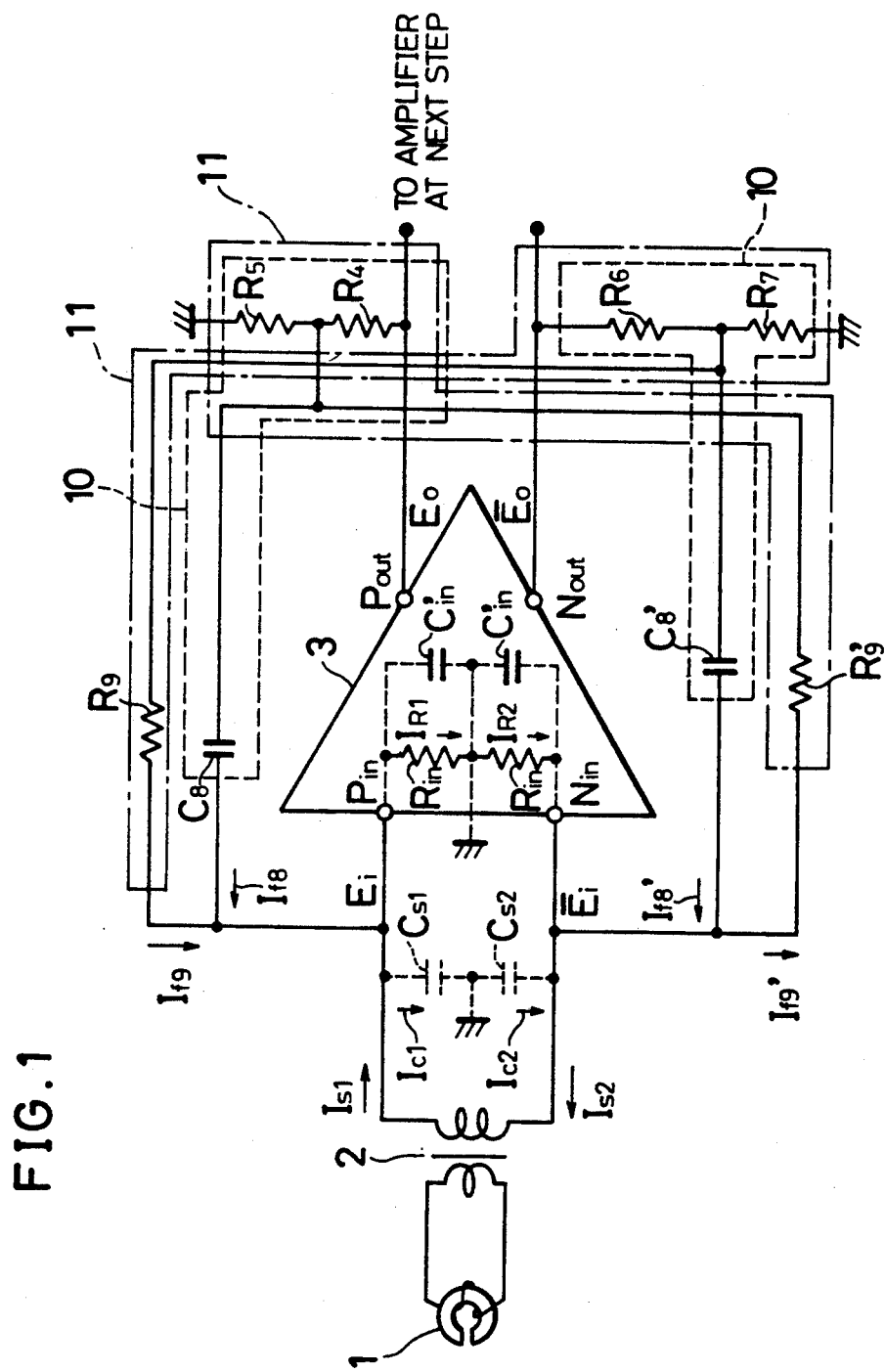
FIGS. 1 to 4 show one way of the preferred embodiment of the present invention.

As shown in FIG. 1, a VTR for HDTV of the present embodiment comprises a magnetic head 1, a rotary transformer 2, and a magnetic reproducing head amplifier 3. In addition, the magnetic reproducing head amplifier 3 comprises a positive feedback circuit system 10 and a negative feedback circuit system 11.

The magnetic head 1, which is secured, for example, to a circumference surface of a rotary drum (not shown), is built so that it may reproduce image signals recorded on a magnetic recording medium such as a magnetic tape, and convert them into electric signals. The image signals reproduced are entered to a negative phase input terminal $N_{in}$ and a positive phase input terminal $P_{in}$ in the magnetic reproducing head amplifier 3 functioning as a differential amplifier through the rotary transformer 2 secured between the rotary drum and the fixed drum. The magnetic reproducing head amplifier 3 is of a balanced input type and also comprises a differential amplification type IC of a balanced output type.

Between the positive phase input terminal $P_{out}$ of the magnetic reproducing head amplifier 3 and ground, there are connected dividing resistors $R_4$ and $R_5$ in series in order from the side of the positive phase input terminal $P_{out}$. A connecting point between the dividing resistors $R_4$ and $R_5$ is connected to the positive phase input terminal $P_{in}$ through a positive feedback capacitor $C_8$. The connecting point between the dividing resistors $R_4$ and $R_5$ is also connected to the negative phase input terminal $N_{in}$ through a negative feedback resistor $R_9'$. The dividing resistors $R_4$ and $R_5$, and the positive feedback capacitor $C_8$ are circuit devices forming a positive feedback circuit system 10. Similarly, the dividing resistors $R_4$ and $R_5$, and the negative feedback resistor $R_9'$ are circuit devices forming a negative feedback circuit system 11.

Between the negative phase output terminal $N_{out}$ of the magnetic reproducing head amplifier 3 and ground, there are connected dividing resistors $R_6$ and $R_7$ in series in order from the side of the terminal $N_{out}$. A connecting point between the dividing resistors $R_6$ and $R_7$ is connected to the positive phase input terminal $P_{in}$ through a negative feedback resistor $R_9$. The connecting point between the dividing resistors $R_6$ and $R_7$ is also connected to the negative phase input terminal $N_{in}$ through a positive feedback capacitor $C_8'$. The dividing resistors $R_6$ and $R_7$, and the positive feedback capacitor $C_8'$ are circuit devices forming the positive feedback circuit system 10. Similarly, the dividing resistors $R_6$ and $R_7$, and the negative feedback resistor $R_9$ are circuit devices forming the negative feedback circuit system 11. In addition, the positive phase output terminal $P_{out}$ and the negative phase output terminal $N_{out}$ are connected to the input of an equalizer (not shown) through a reproducing amplifier (next step amplifier) at the next step downstream, which is not shown in the figure.

The aforementioned dividing resistors $R_4$ to $R_7$ are installed so as to adjust a feedback amount from the output according to an amplification factor of the magnetic reproducing head amplifier 3, in the case where the amplification factor is great. The positive feedback capacitors $C_8$ and $C_8$, are positive feedback devices, and the negative feedback resistors $R_9$ and $R_9'$ are negative feedback devices.

In the above configuration, voltages to ground for the negative phase input terminal $N_{in}$ and the positive phase input terminal $P_{in}$ in the magnetic reproducing head amplifier 3 are expressed as $\overline{E}_i$ and $E_i$ respectively. Voltages to ground for the negative phase output terminal $N_{out}$ and the positive phase output terminal $P_{out}$ are expressed as $\overline{E}_0$ and $E_0$ respectively. Moreover, stray capacitances to ground (including the $C'_{in}=2_{in}$ shown in the figure as the reduced value for the input capacitance $C_{in}$ of the magnetic reproducing amplifier 3) for the positive phase input terminal $P_{in}$ and the negative input terminal $N_{in}$ in the magnetic reproducing head amplifier 3 are expressed as $C_{s1}$ and $C_{s2}$ respectively, and currents pass through these are expressed as $I_{s1}$ and $I_{s2}$ respectively. In addition, there are current components $I_{R1}$ and $I_{R2}$ passing through the input resistors $R_{in}$'s; however the $I_{R1}$ and $I_{R2}$ are small enough to be negligible.

Next, an explanation is given referring to the operation of the magnetic reproducing head amplifier 3. There is no essential difference in its operation between the positive phase side and the negative phase side of the magnetic reproducing head amplifier 3 except the reversed polarity between those circuits. Therefore, the explanation deals with the operation of the positive phase side.

Figure 3:
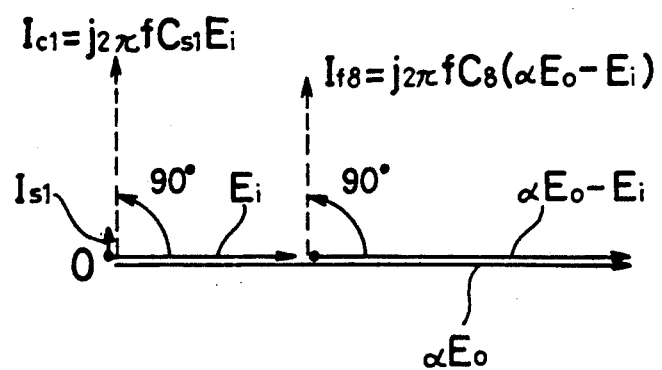

In the case where a signal, which is reproduced by the magnetic head 1 and entered to the magnetic reproducing amplifier 3 through the rotary transformer 2, has a low frequency band, or where stray capacitances to ground $C_{s1}$ and $C_{s2}$ in the magnetic reproducing head amplifier 3 are small, a phase difference between an input $E_i$ at the positive phase input terminal $P_{in}$ and an output $E_o$ at the positive phase output terminal $P_{out}$ is negligible, and therefore $E_i$ and $E_o$ are in the same phase as shown in FIG. 3. In addition, $\alpha$ in FIG. 3 shows a voltage dividing ratio concerning the dividing resistors $R_4$ and $R_5$, and is also referred to as the voltage dividing ratio concerning the dividing resistors $R_6$ and $R_7$ ($\alpha = R_5/(R_4+R_5) = R_7/(R_6+R_7)$).

A charging current $I_{c1}$ flowing to the stray capacitance to ground $C_{s1}$ is expressed as $I_{c1} = j \cdot 2\pi \cdot f \cdot C_{s1} \cdot E_i$, and has a phase difference of 90° to $E_i$ as shown in FIG.

3. Moreover, a positive feedback current $I_{f8}$, which is positively fed back to the input $E_i$ through a positive feedback capacitor $C_8$, is expressed as $I_{f8}=j\cdot2\pi\cdot f\cdot C_8(\alpha E_o-E_i)$, and has a phase difference of 90° to $E_o$, thereby being in the same phase as $I_{c1}$.

Consequently, the charging current $I_{c1}$ to flow into the stray capacitance to ground $C_{s1}$ is mostly supplied with the positive feedback current $I_{f8}$, and from a signal source, only the differential current $I_{s1}$ between $I_{c1}$ and $I_{f8}$ is supplied to the stray capacitance to ground $C_{s1}$; therefore the supply current to $C_{s1}$ from the signal source may be reduced by a large margin. As a result, since an effective capacitance becomes smaller, a resonance frequency may be kept high.

The positive feedback current $I_{f8}$ varies according to a voltage obtained by dividing the output $E_o$ by the dividing resistors $R_4$ and $R_5$, and therefore by properly selecting a dividing ratio as well as the value of $C_8$, a compensation for the capacitance current $I_{s1}$ flowing to the stray capacitance to ground $C_{s1}$ may be appropriately achieved even in the case where the amplification factor of the magnetic reproducing head amplifier 3 is great.

On the other hand, a current $I_{f9}$, which passes through the negative feedback resistor $R_9$ from the output $E_o$ to the input $E_i$, has a negative phase to the input $E_i$, and functions to dump the resonance characteristic of the input resonance circuit by its negative feedback operation. By the use of the negative feedback current $I_{f9}$, which varies according to a voltage obtained by dividing the output $\bar{E}_o$ by the dividing resistors $R_6$ and $R_7$, the output amplitude characteristic of the magnetic reproducing amplifier 3 is dumped as shown in a curve (N) in FIG. 2. In addition, a curve (M) shows a frequency characteristic of a gain which is obtained without using the negative feedback.

Figure 2:
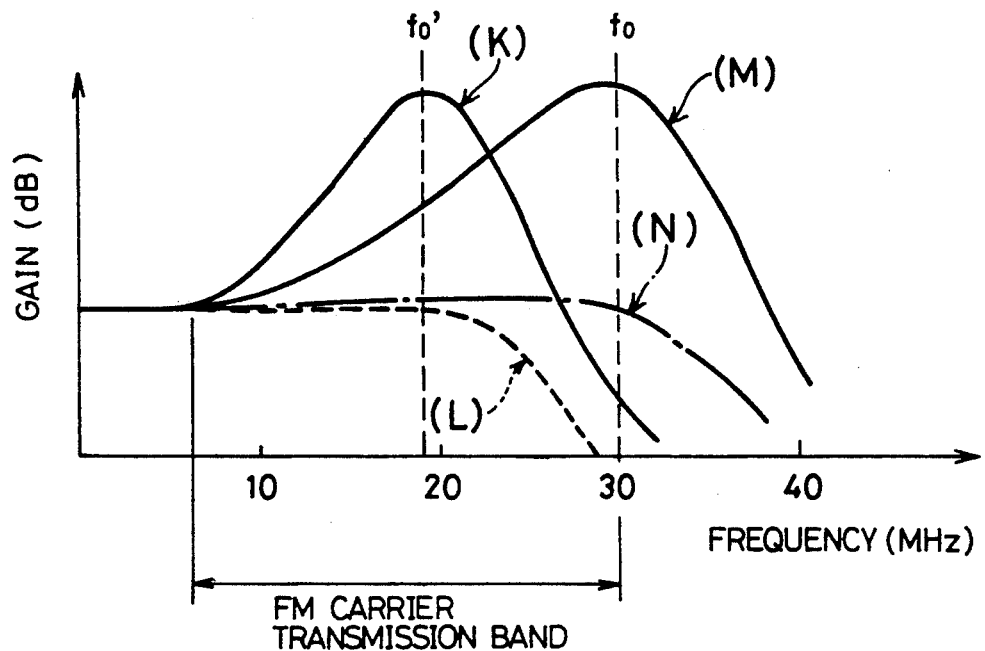

In contrast to the above, in the case where the stray capacitances to ground $C_{s1}$ and $C_{s2}$ (including the reduced value for the amplifier input capacitance $2C_{in}$) in the input part of the magnetic reproducing head amplifier 3 are great in transmitting a FM carrier with wide band, if a feedback operation is not performed, a resonance frequency in the resonance circuit formed by the stray capacitances to ground $C_{s1}$ and $C_{s2}$ as well as by the inductance of the magnetic head 1 is reduced to $f_o'$, as shown in a curve (K) in FIG. 2, and is shifted so as to have its characteristic of the resonance frequency within the FM carrier transmission band. In this case, if only a negative feedback operation is applied, the output amplitude characteristic of the magnetic reproducing amplifier 3 is almost flattened because of the resonance characteristic dumping as shown in a curve (L) in FIG. 2.

Figure 4:
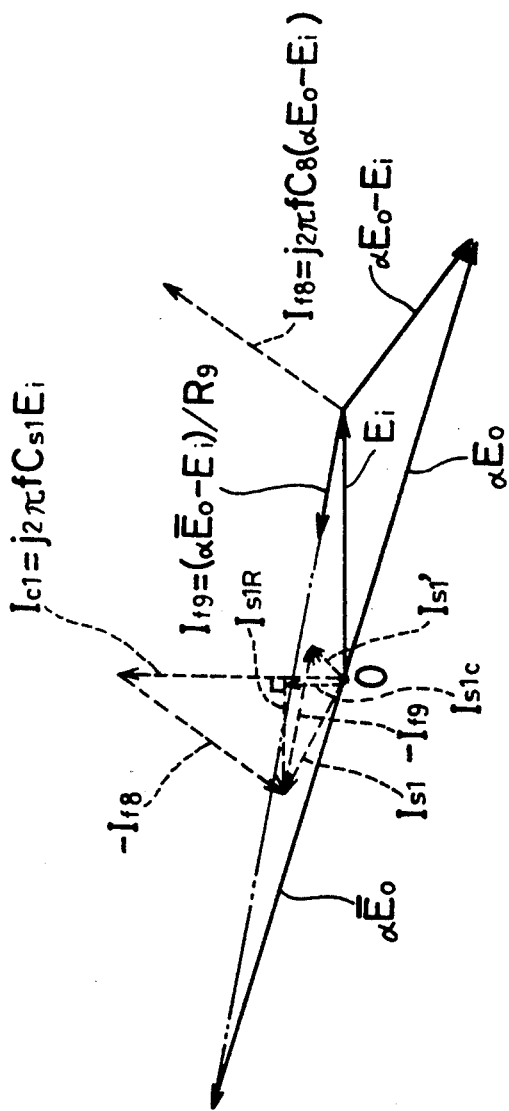

In the meantime, as to a high frequency band, the output $E_0$ of the magnetic reproducing head amplifier 3 sometimes has a phase delay to the input $E_i$ as shown in FIG. 4. In the figure, $\alpha$ represents a dividing ratio concerning the dividing resistors $R_4$ and $R_5$ as well as $R_6$ and $R_7$ similar to that shown in FIG. 3.

When such a phase delay as shown in the figure is produced, a phase difference between the positive feedback current $I_{f8}$ and the charging current $I_{c1}$ flowing to the stray capacitance to ground $C_{s1}$ doesn't come to 0°, and the current $I_{s1}$ which flows to the stray capacitance to ground $C_{s1}$ from the signal source is given as a vector difference between $I_{c1}$ and $I_{f8}$ as shown in FIG. 4. As a result, the input $E_i$ comes to contain a negative resistor current component $I_{s1R}$ besides a capacitance current component $I_{s1c}$. When the current component $I_{s1R}$ becomes greater than a current flowing to the input resistor $R_{in}$, an oscillation is produced, and therefore the amplification function for wide band of the magnetic reproducing amplifier 3 fails to work well.

Hereupon, in order to eliminate the negative resistor current component $I_{s1R}$, the negative feedback current $I_{f9}$ may be supplied to the positive phase input terminal $P_{in}$ from the output $\bar{E}_0$ of the negative phase output terminal $N_{out}$ through the negative feedback resistor $R_9$, and thereby a stable amplification function may be maintained without having a CN ratio for the FM carrier reduced. More specifically, since $I_{f9}=(\alpha \bar{E}_0-E_i)/R_9$ is supplied to the input $E_i$, the signal source current $I_{s1}$ is changed into $I_{s1}'$ as shown in FIG. 4, and thereby the negative resistor current component becomes smaller.

Generally, a stable amplification function may not be achieved only by the use of positive feedback, by functioning a negative feedback as well as a positive feedback at the same time, the resonance frequency $f_0$ may be shifted to the vicinity of the upper limit of the FM carrier transmission band as shown in a curve (M) in FIG. 2, and therefore the magnetic reproducing head amplifier 3 may perform its amplification operation for wide band in a stable state. In addition, in the present embodiment, the explanation was given referring to a magnetic reproducing head amplifier for a magnetic recording/reproducing apparatus, the present invention is generally applicable to any case wherein signals with wide band have to be amplified.

Next, referring to FIG. 5, another embodiment of the present invention is described as follows. In addition, the corresponding means are suffixed with the same reference numerals and symbols in the aforementioned embodiment for convenience, and a detailed explanation is omitted.

Figure 5:
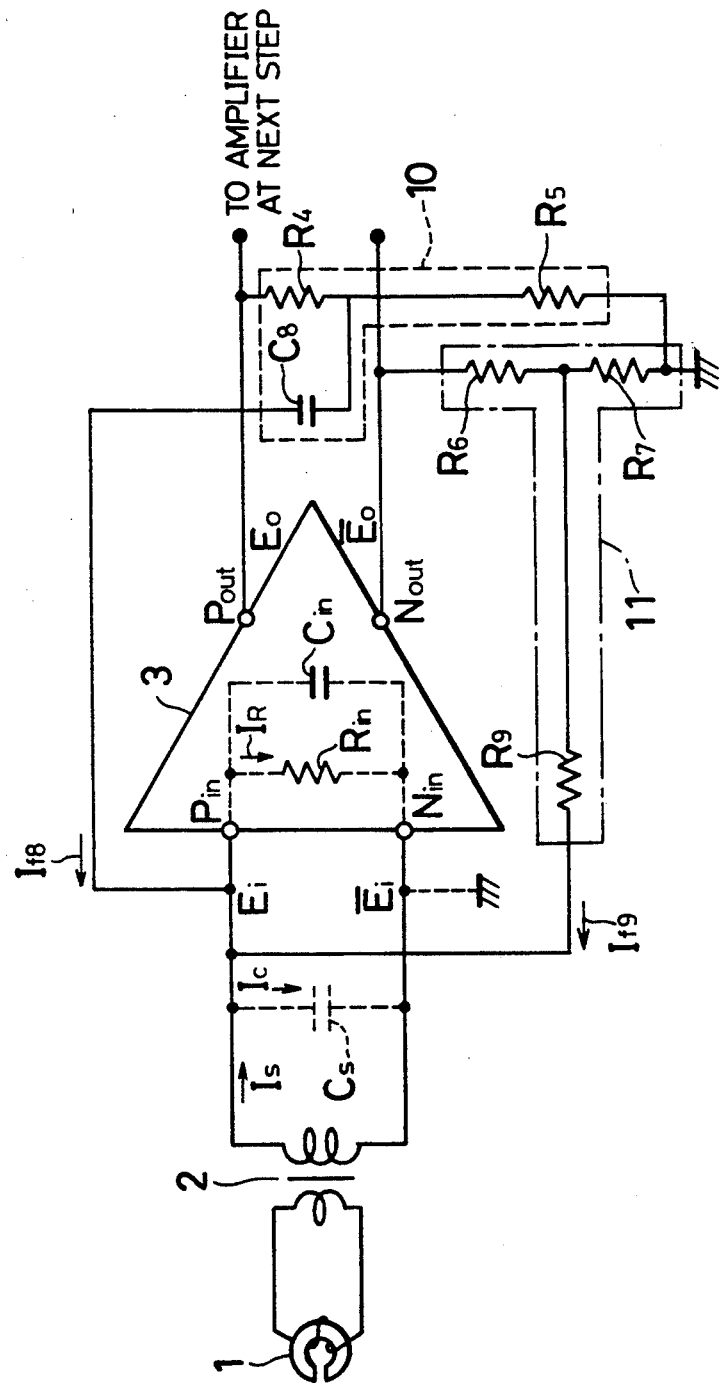
FIGS. 5 and 6 are circuit schematics respectively showing magnetic reproducing head amplifiers of other embodiments.

In the configuration of the embodiment presented here, as shown in FIG. 5, image signals reproduced by a magnetic head 1 are entered to a magnetic reproducing head amplifier 3 through a rotary transformer 2, and the magnetic head amplifier 3 comprises differential amplification type IC's of a balanced output type.

A negative phase input terminal $N_{in}$ of the magnetic head amplifier 3 is connected to ground. However, in a practical use, the negative input terminal $N_{in}$ is not necessarily earthed, since the same effect may be achieved without being earthed. A positive feedback device is formed only by a positive feedback capacitor $C_8$. The positive feedback capacitor $C_8$ is connected between a connecting point, at which dividing resistors $R_4$ and $R_5$ are connected, and the positive phase input terminal $P_{in}$. Moreover, a negative feedback device is formed only by a negative feedback resistor $R_9$. The negative feedback resistor $R_9$ is connected between a connecting point, at which dividing resistors $R_6$ and $R_7$ are connected, and the positive phase input terminal $P_{in}$.

In the embodiment presented here, similar to the aforementioned embodiment, positive and negative feedbacks simultaneously made by the positive feedback capacitor $C_8$ and the negative feedback resistor $R_9$ enable the input amplitude characteristic of the magnetic reproducing head amplifier 3 to be flattened, and suitable for wide band.

Next, referring to FIG. 6, still another embodiment of the present invention is described as follows. In addition, the corresponding means are suffixed with the same reference numerals and symbols for convenience in the aforementioned embodiment, and a detailed explanation is omitted.

Figure 6:
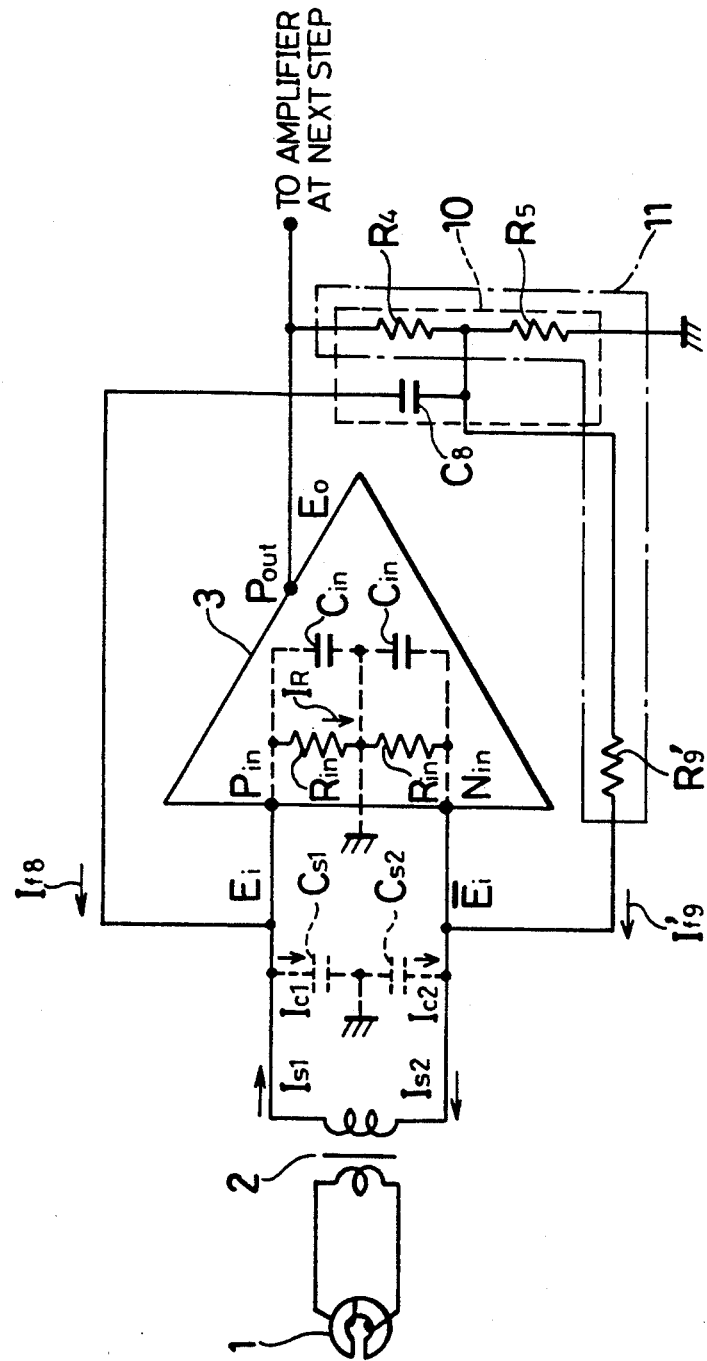
Figure 7:
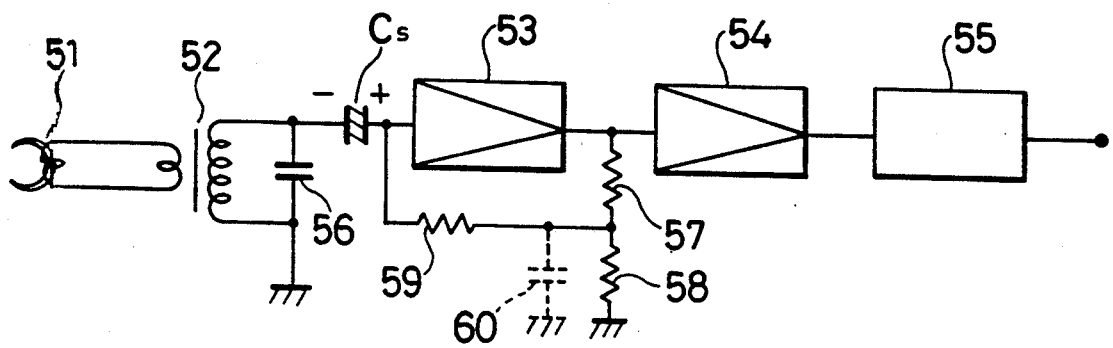
FIGS. 7 to 15 are the examples of prior arts.
Figure 8:
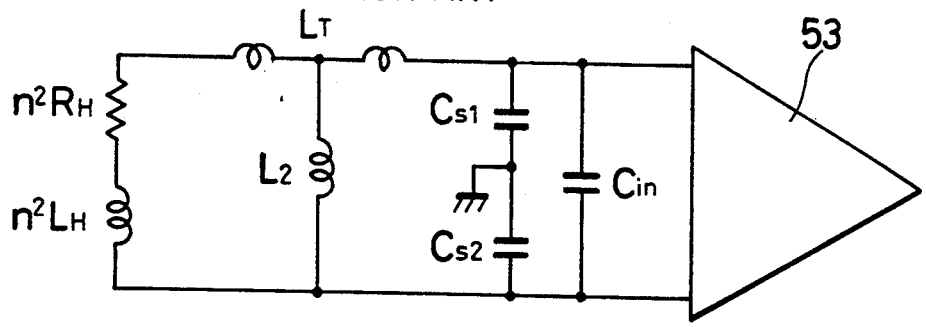
Figure 9:
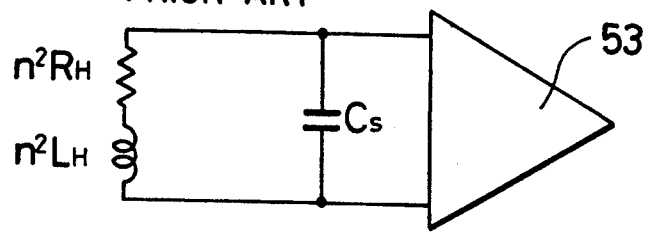
Figure 10:
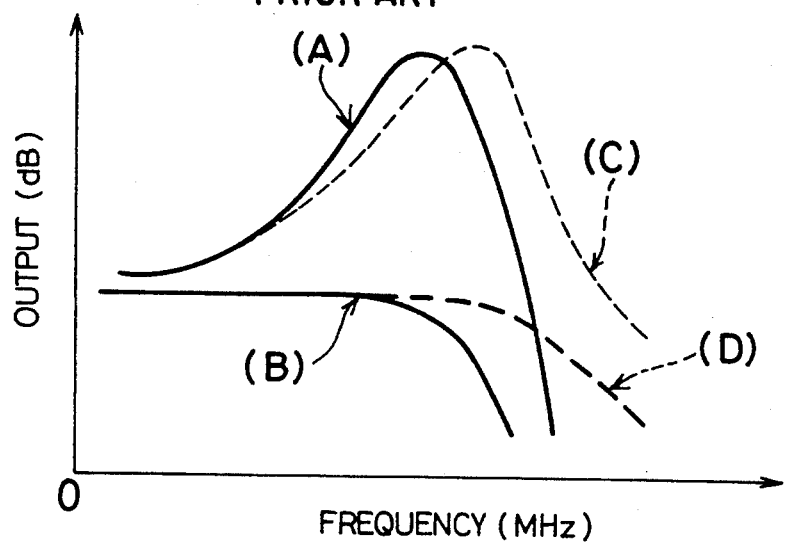
Figure 11:
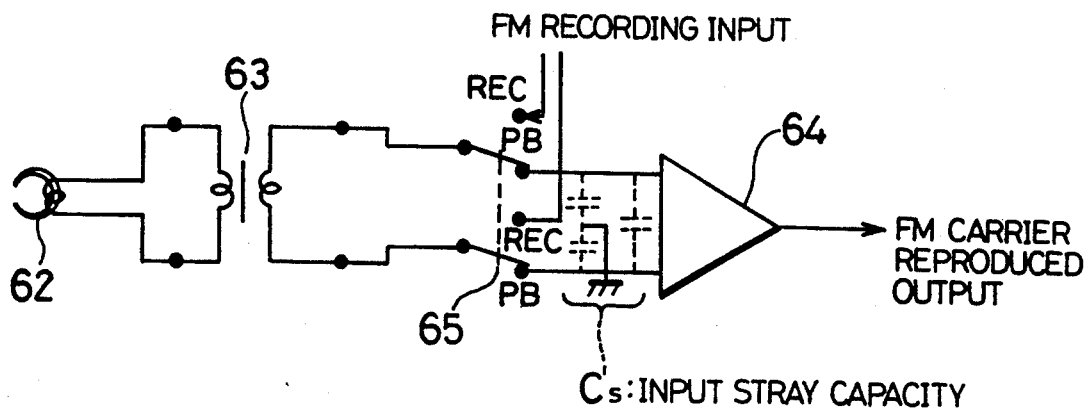
Figure 12:
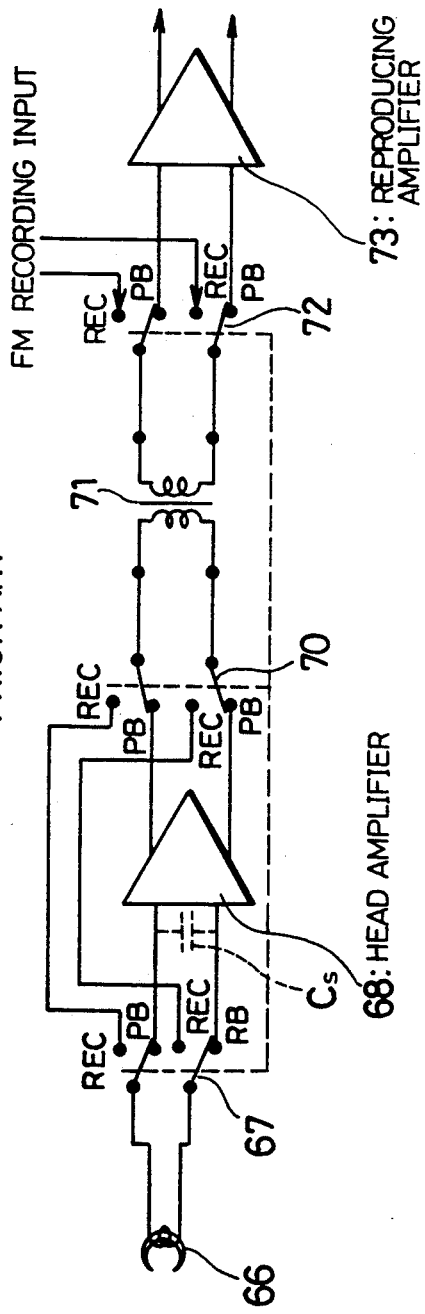
Figure 13:
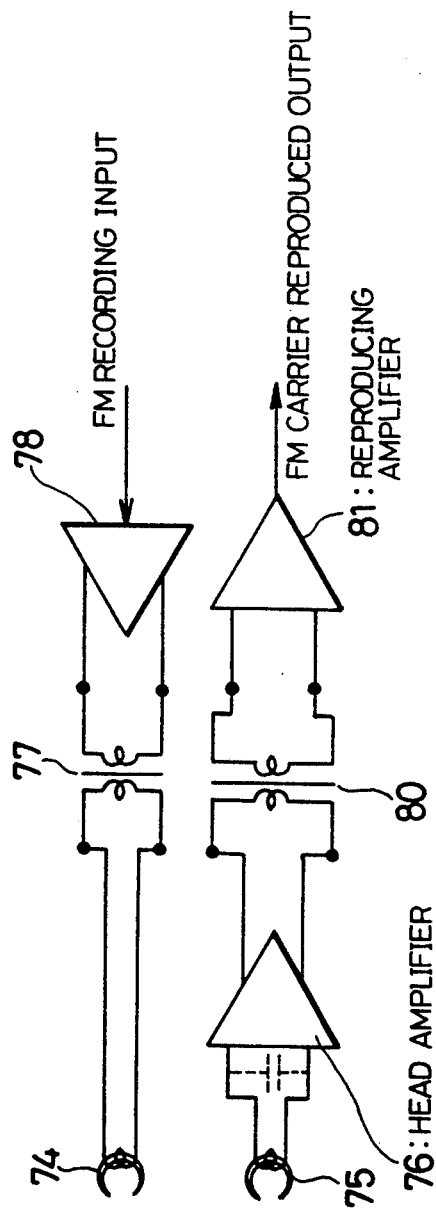
Figure 14:
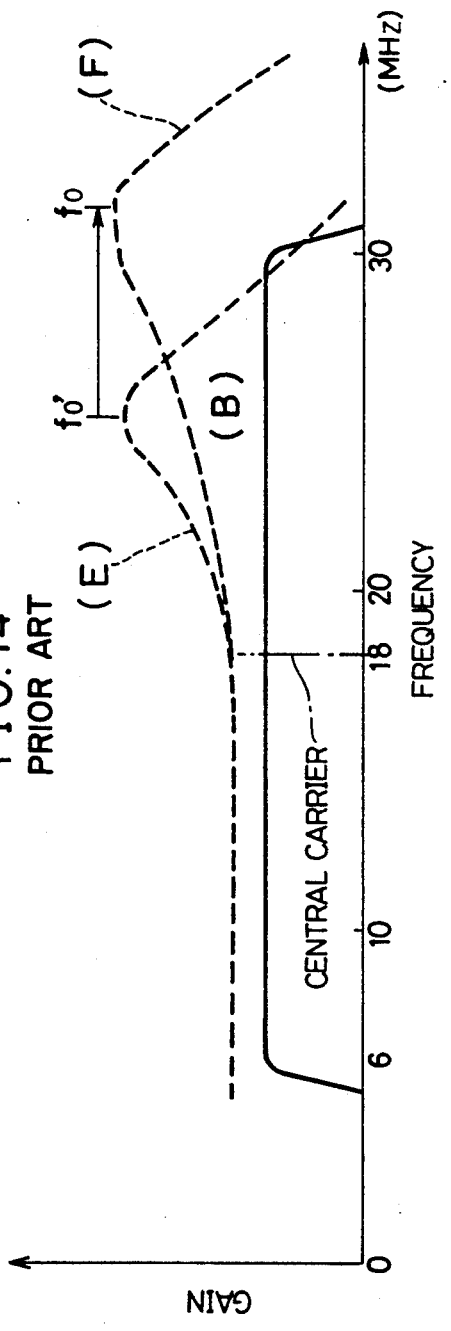
Figure 15:
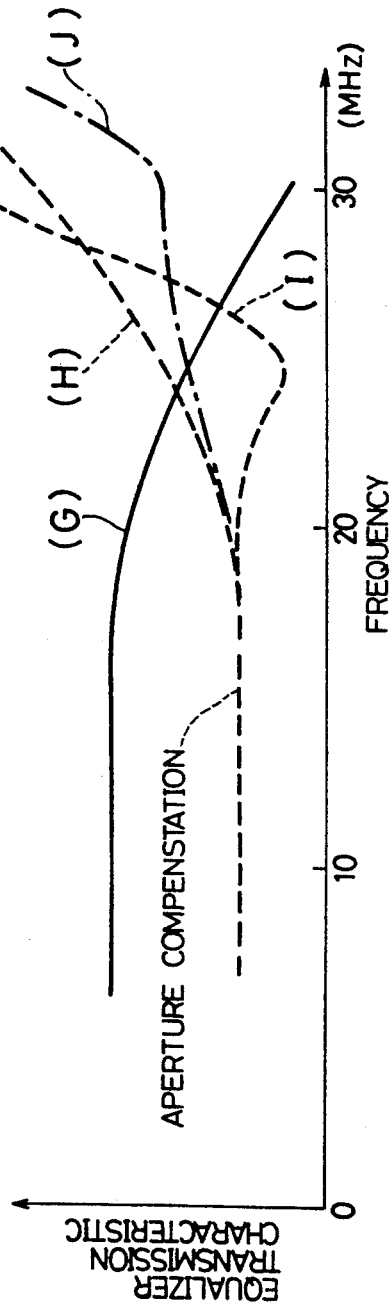

In the configuration of the embodiment presented here, as shown in FIG. 6, image signals reproduced by a magnetic head 1 are entered to a magnetic reproducing head amplifier 3 through a rotary transformer 2, and the magnetic head amplifier 3 comprises differential amplification type IC's of a balanced input type. A negative phase output terminal $N_{out}$ of the magnetic reproducing head amplifier 3 is not installed, or is not used even if it is installed. A positive feedback device is formed only by a positive feedback capacitor $C_8$. The positive feedback capacitor $C_8$ is connected between a connecting point, at which dividing resistors $R_4$ and $R_5$ are connected, and a positive phase input terminal $P_{in}$. Moreover, a negative feedback device is formed only by a negative feedback resistor $R_9'$. The resistor $R_9'$ is connected between a connecting point, at which dividing resistors $R_4$ and $R_5$ are connected, and a negative phase input terminal $P_{in}$.

Also in the embodiment presented here, similar to the aforementioned embodiment, positive and negative feedbacks simultaneously made by the positive feedback capacitor $C_8$ and the negative feedback resistor $R_9'$ enable the input amplitude characteristic of the magnetic reproducing head amplifier 3 to be flattened, and suitable for wide band.

As is aforementioned, the magnetic reproducing head amplifier of the present invention has a configuration wherein a positive feedback as well as a negative one is simultaneously performed by adding the positive feedback circuit and the negative one to its differential amplifier.

According to the configuration, a resonance frequency within a transmission frequency band may be shifted to the vicinity of the upper limit of the frequency band by utilizing the frequency characteristic of the magnetic reproducing head amplifier. The reproducing equalizer may obtain an amplitude equalization characteristic for its original purpose easily and stably. Besides, an inverted compensation (a compensation by FM equalization) for a resonance peak existing within the transmission frequency band may be performed without overlapping each other with the FM equalization performed by the equalizer, and thereby required characteristics may be stably maintained.

Moreover, by making a turn ratio in the rotary transformer to have greater value, a CN ratio (carrier to noise ratio) for the head amplifier output may be improved.

The invention being thus described, it may be obvious that the same may be varies in many ways. Such variations are not to be regarded as a departure from the scope of the invention.

There are described above novel features which the skilled man will appreciate give rise to advantages. These are each independent aspects of the invention to be covered by the present application, irrespective of whether or not they are included within the scope of the following claims.

What is claimed is:

1. A magnetic reproducing head amplifier for amplifying FM carriers having a differential amplifier of a balanced input/output type including a positive phase input terminal and a negative phase input terminal, comprising:

a positive phase dividing circuit for dividing the voltage of positive phase output from the differential amplifier;

a first negative feedback device which is connected between the positive phase dividing circuit and the negative phase input terminal of the differential amplifier in order to pass a negative feedback current varying according to the output from the positive phase dividing circuit;

a negative phase dividing circuit for dividing the voltage of negative phase output from the differential amplifier;

a second negative feedback device which is connected between the negative phase dividing circuit and the positive phase input terminal of the differential amplifier in order to pass a negative feedback current varying according to the output from the negative phase dividing circuit;

a first positive feedback device which is connected between the positive phase dividing circuit and the positive phase input terminal of the differential amplifier in order to pass a positive feedback current varying according to the output from the positive phase dividing circuit, and;

a second positive feedback device which is connected between the negative phase dividing circuit and the negative phase input terminal of the differential amplifier in order to pass a positive feedback current varying according to the output from the positive phase dividing circuit.

2. A magnetic reproducing head amplifier as defined in claim 1, wherein the positive phase dividing circuit and the negative phase dividing circuit comprise a plurality of resistors respectively.

3. A magnetic reproducing head amplifier as defined in claim 1, wherein the first negative feedback device as well as the second one is a resistor.

4. A magnetic reproducing head amplifier as defined in claim 1, wherein the first positive feedback device as well as the second one is a capacitor.

5. A magnetic reproducing head amplifier for amplifying FM carriers having a differential amplifier of a balanced input type including a positive phase input terminal and negative phase input terminal, comprising:

a positive phase dividing circuit for dividing the voltage of positive phase output from the differential amplifier;

a positive feedback device which is connected between the positive phase dividing circuit and the positive phase input terminal of the differential amplifier in order to pass a positive feedback current varying according to the output from the positive phase dividing circuit, and;

a negative feedback device which is connected between the positive phase dividing circuit and the negative phase input terminal of the differential amplifier in order to pass a negative feedback current varying according to the output from the positive phase dividing circuit.

6. A magnetic reproducing head amplifier as defined in claim 5, wherein the positive feedback device is a capacitor, and the negative feedback device is a resistor.

7. A magnetic reproducing head amplifier as defined in claim 5, wherein the positive phase dividing circuit comprises a plurality of resistors.

* * * * *